United States Patent [19]

LaBaw

[11] Patent Number: 5,159,199
[45] Date of Patent: Oct. 27, 1992

[54] INTEGRATED FILTER AND DETECTOR ARRAY FOR SPECTRAL IMAGING

[75] Inventor: Clayton C. LaBaw, Sunland, Calif.

[73] Assignee: The United States of America as represented by the Administrator of the National Aeronautics and Space Administration, Washington, D.C.

[21] Appl. No.: 744,197

[22] Filed: Aug. 12, 1991

[51] Int. Cl.[5] .......................... G01N 21/27; G02B 5/20
[52] U.S. Cl. ..................... 250/339; 356/328; 357/30; 359/859
[58] Field of Search ....................... 357/30 L; 359/859; 356/328; 250/339

[56] References Cited

U.S. PATENT DOCUMENTS

| | | | |
|---|---|---|---|
| 3,869,212 | 3/1975 | Burcher et al. | 356/419 |
| 4,783,594 | 11/1988 | Schulte et al. | 250/370.08 |
| 4,910,401 | 3/1990 | Woods | 250/332 |
| 4,910,523 | 3/1990 | Huguenin et al. | 342/179 |
| 4,939,369 | 7/1990 | Elabd | 250/332 |
| 4,940,895 | 7/1990 | Mansfield | 250/332 |
| 4,975,581 | 12/1990 | Robinson et al. | 250/339 |
| 4,988,858 | 1/1991 | Pinson | 250/208.1 |
| 5,020,910 | 6/1991 | Dunn et al. | 356/328 |

FOREIGN PATENT DOCUMENTS 0152353  8/1985  European Pat. Off. .......... 357/30 L

OTHER PUBLICATIONS

Hong-Yee Chiu and Williams Collins, "A Spectroradiometer for Airborne Remote Sensing" *Photographic Engineering and Remote Sensing*, vol. 44, No. 4 (Apr. 1978) pp. 507–517.

*Primary Examiner*—Constantine Hannaher
*Attorney, Agent, or Firm*—John H. Kusmiss; Thomas H. Jones; Guy M. Miller

[57] ABSTRACT

A spectral imaging system having an integrated filter and photodetector array. The filter has narrow transmission bands which vary in frequency along the photodetector array. The frequency variation of the transmission bands is matched to, and aligned with, the frequency variation of a received spectral image. The filter is deposited directly on the photodetector array by a low temperature deposition process. By depositing the filter directly on the photodetector array, permanent alignment is achieved for all temperatures, spectral crosstalk is substantially eliminated, and a high signal-to-noise ratio is achieved.

22 Claims, 3 Drawing Sheets

INTEGRATED FILTER AND DETECTOR ARRAY FOR SPECTRAL IMAGING

ORIGIN OF THE INVENTION

The invention described herein was made in the performance of work under a NASA contract, and is subject to the provisions of Public Law 96-517 (35 U.S.C. Section 202) in which the Contractor has elected not to retain title.

TECHNICAL FIELD

The subject invention relates generally to a spectral imaging detector system and, more particularly, to a spectral imaging detector system having a photodetector array with a linear variable optical filter.

BACKGROUND ART

Rejection of unwanted stray and background radiation falling on a detector of an imaging system can significantly improve the signal-to-noise ratio of the system. In applications where signal and background radiation are in the same waveband, such selective rejection is essential.

Terrestrial observing systems which operate in the infrared are particularly sensitive, since infrared wavelengths are emitted by surfaces surrounding the target which are at the same temperature as the target. Also, the imaging system itself and the imaging system platform emit infrared wavelengths. For space reconnaissance applications, this difficulty may also occur at ultraviolet and visible wavelengths.

The most common solution has been to cool the system to below 200K to suppress background radiation, to carefully baffle the optical train, and to isolate the instrument from all heat sources. However, the implementation of such techniques often results in unacceptable penalties in weight, volume, complexity, or cost.

For an imaging system receiving an image having only a fixed narrow frequency, the provision of a fixed-frequency narrow-band optical interference filter mounted to the detector adequately eliminates most stray and background radiation.

For spectral imaging systems, the provision of an optical filter, the transmittance of which varies linearly in wavelength with location on the filter, helps to eliminate stray and background radiation. The filter is mounted to the detector of the system, and is matched to the frequencies of the spectrum of the image such that, for each frequency, the filter transmits only the target frequency.

However, with such a transmission-frequency-varying filter, the frequency variation of the filter must be precisely matched to the frequency dispersion provided by the diffraction element of the system. As such, the filter must be mounted to, and aligned with, the other elements of the imaging system with extreme precision.

Any lateral displacement of the filter with respect to an incoming spectral signal results in a spectral mismatch such that detection of the spectral signal is severely degraded. Displacement relative to the detector causes a wavelength error in proportion to the amount of displacement.

Any possible misalignment of the filter along the spatial axis of the detector can be remedied by providing a filter having a transmission area oversized in the spatial direction. However, misalignment along the spectral axis of the detector cannot substantially exceed 0.1 detector element pitch unit before a resulting mismatch between filter transmission and dispersed signal become significant and degrades performance. Likewise, rotation between filter and detector axes produces a degrading effect, causing loss of signal and spectral dilution or blurring.

Further, any tilting of the filter with respect to the incident angle of the spectral image causes defocusing and introduces the possibility of damaging mechanical contact.

An additional problem arises from the necessity to mount the filter close to the sensitive photosurface. Space must be provided for relative movement during shock or vibration. However, space between the filter and the detector leads to the spectral mixing, i.e., crosstalk, of adjacent columns.

The spacing between separated filter/detector assemblies must be maintained at a minimum of about 50 micrometers ($\mu$m) to prevent contact between the elements resulting from thermal distortions and vibration induced motion. Thus, a limit to the signal-to-noise ratio enhancement is encountered.

Each of these factors is exacerbated in a system in which the filter and detector are aligned at room temperature, then cooled to an operational temperature. If thermal characteristics of the filter and relative movement of the filter and detector during cooldown are not correctly predicted, the filter or the detector may be destroyed. In any event, to achieve proper alignment, an iterative process is employed which requires considerable time and finesse to successfully complete.

Prior art optical systems, including a detector and a filter, are found in, for example, U.S. Pat. No. 4,783,594 to Schulte et al., U.S. Pat. No. 4,939,369 to Elabd, U.S. Pat. No. 4,910,401 to Woods, U.S. Pat. No. 4,910,523 to Huquenin et al., and U.S. Pat. No. 4,940,895 to Mansfield.

The Schulte et al. and Elabd patents each disclose a system having a detector with a filter coated directly thereon. The Woods, Huquenin et al., and Mansfield patents each disclose a system with a filter mounted to a detector. However, none disclose a frequency-transmission-varying filter mounted to or coated on a detector and, thus, none are concerned with the particular problems associated with such filters.

As can be appreciated, there exists a need for an improved spectral imaging system with a frequency-transmission-varying filter which eliminates the mounting of a filter adjacent to a detector.

STATEMENT OF THE INVENTION

It is therefore an object of the present invention to provide an improved spectral imaging system;

It is another object of the invention to provide a spectral imaging system with a detector array and linear variable filter wherein the filter need not be separately mounted adjacent to the detector;

It is a further object of the invention to provide a spectral imaging system with detector array and linear variable filter which maintain alignment at both room temperature and operational temperature;

It is still another object of the invention to provide a spectral imaging system with detector array and linear variable filter which maintain alignment despite shock or vibration; and It is yet a further object of the invention to provide a spectral imaging system with detector array and linear variable filter with optimum power transmission.

These and other objects and advantages of the present invention are achieved by providing a spectral imaging system having: means for receiving an optical signal from a target, dispersion means for dispersing the optical signal into a spectral signal with the component spectra of the optical signal provided along a spectral axis having a frequency range, and detector means aligned with the spectral axis of the spectral signal for receiving and detecting the spectral signal. The detector means includes an optical filter deposited directly thereon for substantially eliminating stray and background optical signals from being detected by the detector means. The optical filter has a transmission frequency which varies along the detector. The optical filter is aligned with the spectral axis of the spectral signal and is matched to the frequency range thereof.

The optical filter is directly deposited on the detector means such that the optical filter remains in alignment with the detector means despite temperature changes, shock, or vibration.

In accordance with a preferred embodiment, the spectral imaging system is adapted to detect the infrared spectrum of the target, with the dispersion means being a diffraction grating, and the detector means being a discrete photodetector array. The discrete photodetector array includes a charge coupled device multiplexer (CCD MUX) provided on a semiconductor substrate, a plurality of closely spaced indium beads mounted onto the CCD MUX, and a doped photosite array electrically connected to the CCD MUX via the indium beads. The photosite array comprises a silicon or gallium arsenide photosite array.

The provision of direct deposition of the filter onto the detector eliminates difficult mounting and alignment problems. A new generation of inexpensive, compact imaging spectrometers for any wavebands is thereby achieved.

Thus, the invention exploits recent advances in the production of optical filters which allow such filters to be directly applied onto photodetector arrays.

For detectors required to operate at wavelengths beyond the sensitivities of Si or GaAs, the photosite array is fabricated by spot diffusion doping of an extrinsic semiconductor (e.g., As or Br on Si, etc.) or by direct microlithography of a sensitive material (e.g., InSb, HgCdTe, etc.).

The photosite array is mounted to a semiconductor charge coupled device multiplexer through the array of metal beads composed of a soft metal such as indium with beads, one bead per photosite.

Such metal beads become too soft if the temperature exceeds about 70° C. Therefore, if the filter deposition process requires a high temperature, the filter must be coated onto the photosite array and then cooled before the photosite array is mounted to the metal beads.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

DETAILED DESCRIPTION OF THE INVENTION

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a spectral imaging system.

Figure 1:
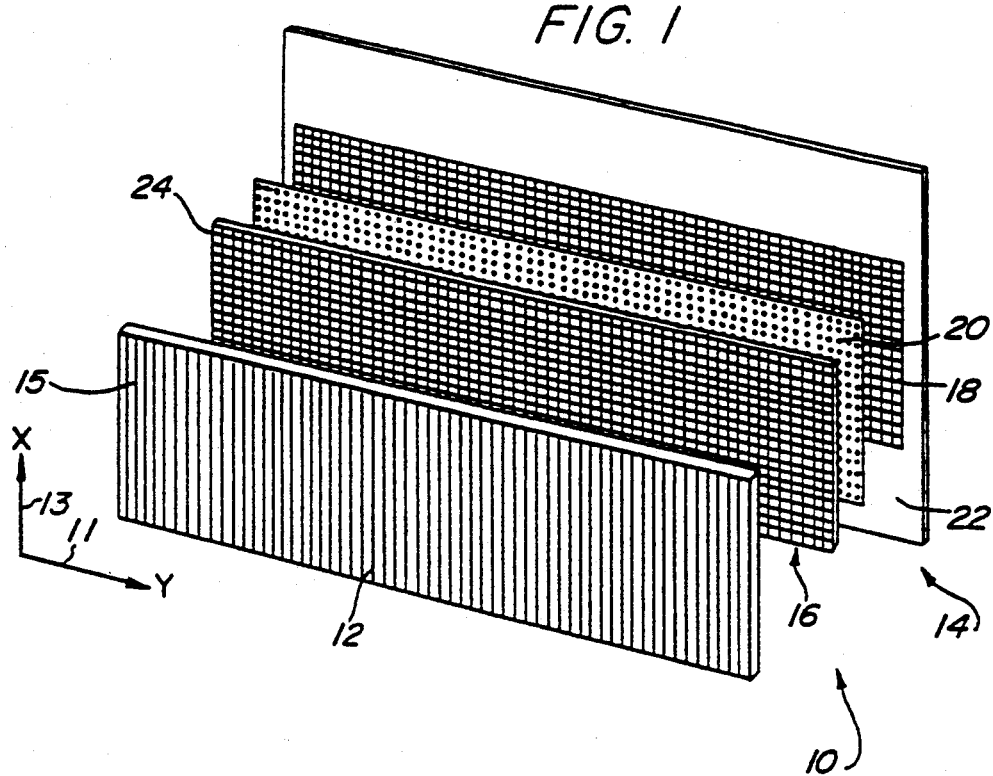
FIG. 1 is an exploded view of a preferred embodiment of the present invention, showing a detector array with a transmission-frequency-varying optical filter deposited directly thereon.

With reference to FIG. 1, a spectral image detector 10 is shown which includes a transmission-frequency-varying optical filter 12 deposited directly on a photoarray detector 14.

An optical system (not shown in FIG. 1) projects an image of the infrared spectrum of a target onto detector 10. Hereinafter, the image of the infrared spectrum of a target is alternatively referred to as either "the spectrum" or "the spectral image".

The spectral image is a conventional two-dimensional image including a spectral axis 11 over which the frequency of the spectrum varies, and a spatial axis 13 over which no frequency variation occurs. The spectral image can comprise, for example, an infrared spectrum emitted by an astronomical object or by a portion of the surface of the earth.

Photoarray detector 14 converts the spectral image into a digital image for subsequent digital processing. Optical filter 12 is provided to substantially eliminate stray and background infrared radiation from being received by photoarray detector 14.

If detector 10 received only a fixed frequency of infrared light, optical filter 12 could comprise a conventional narrow-passband filter having a transmission frequency centered at the frequency of received light. However, since detector 10 receives the spectrum of a target, rather than only one frequency, a fixed frequency optical filter is not adequate. Rather, optical filter 12 comprises a narrow transmission-band infrared filter having a transmission frequency which varies in location along spectral axis 11 such that, at each location along the spectral axis, the filter transmits only light having a frequency corresponding to the frequency of the spectrum of the target image at that location.

Photoarray detector 14 includes a doped photosite array 16 comprising an array of pixels 24 composed of a material photoelectrically sensitive to infrared light. Doped photosite array 16 is mated to a charge coupled device multiplexer (CCD MUX) 18 formed on a portion of a semiconductor substrate 22. An array of beads of indium 18, or other of soft conducting material, is mounted between photoarray detector 14 and CCD MUX 18 with each individual indium bead 20 positioned between a charge collection site of CCD MUX 18 and a pixel 24 of photoarray detector 14. During manufacture, the array of indium beads 20 are pressed between CCD MUX 18 and photoarray detector 14 such that the soft indium beads create electrically conducting contacts between pixels 24 of photodetector array 14 and corresponding charge collection sites of CCD MUX 18.

As shown in FIG. 1, CCD MUX 18 is formed on only a portion of substrate 22. The remainder of substrate 22 can include, e.g., solid state electronics (not shown) for accessing CCD MUX 18.

As an infrared spectral image is projected onto photoarray detector 14, each photoelectrically sensitive pixel 24 generates an electrical charge in response to the intensity of light illuminating the pixel. The electrical charge from each pixel 24 is conducted through a respective underlying indium bead 20 to a corresponding charge collection site on CCD MUX 18. Electrical charges detected by the charge collection sites on CCD MUX 18 are processed by conventional means to produce elements of a digital reproduction of the spectral image.

Having described the invention generally, the optical filter will now be discussed in greater detail.

The fabrication of a conventional single frequency narrow-band optical interference filter is a common art practiced by numerous commercial entities. The fabrication process involves the deposition at low temperatures of several layers of materials of differing indices of refraction on a filter-substrate (not shown) that is transparent at a chosen optical frequency. The number and thickness of layers required to create a filter having a predetermined transmission frequency and bandwidth is readily calculable. The fabrication process is conventionally applied to one entire surface of the filter-substrate, with the filter-substrate subsequently mounted in front of a detector.

In contrast, optical filter 12 of the invention is deposited directly onto detector array 14 rather than onto a separate filter-substrate.

To produce the frequency-transmission-varying filter of the invention, two additional modifications are made to the aforementioned deposition process.

First, the area of deposition is reduced by use of a mask (not shown) to a narrow band extending the width of array 16 (along axis 13), but being only as wide as a predetermined "elemental wavelength increment", with the "elemental wavelength increment" typically 1% of the length of array 16 (along axis 11).

Second, the mask is translated during the deposition process across the width of detector 14 to provide a series of such narrow bands, generally denoted by reference numeral 15. Simultaneously, the rate of deposition is varied such that bands 15 vary in depth. Thus, each band 15 has a different transmission frequency. The rate of deposition can be further varied to produce a nonlinear variation in transmission frequency to match any nonlinear frequency variation of the spectral image produced by a diffraction grating.

Alternatively, the rate of deposition is held constant while the mask is translated at a nonlinear varying rate.

Alternatively, rather than producing a series of discrete bands, the deposition and translation processes can be implemented simultaneously, continuously, and linearly to produce a filter having a spectral continuum, i.e., the resulting filter has no discrete bands or boundaries.

Figure 2:
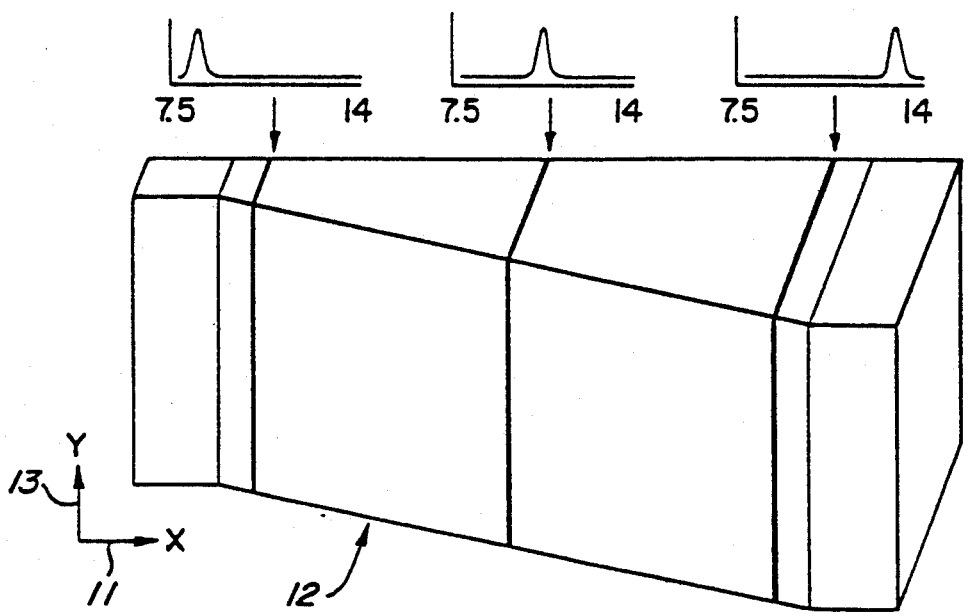
FIG. 2 is a graph showing the variation in transmission frequency of the filter of FIG. 1.

An exemplary optical filter is shown in FIG. 2, with exemplary transmission wavelengths also shown. As can be seen, the transmission wavelength of filter 12 varies along spectral axis 11, with the variation in transmission wavelength represented as a variation in thickness of the filter. The variation in thickness is 35 representative only — the actual filter may not vary in thickness. Wavelength in FIG. 2 is represented in microns.

The transmission wavelength variation of exemplary optical filter 12 in FIG. 2 is shown as being linear. However, any suitable variation can be produced and, as noted above, a nonlinear variation may be needed to match a nonlinear spectral image.

Thus, by modifying a conventional low temperature deposition process available through commercial interference filter manufacturers, optical filter 12 is deposited directly onto detector array 14.

By depositing a transmission-frequency-varying filter directly onto photoarray 14 in accordance with the invention, detector 10 achieves the desired advantages of avoiding signal degradation inherent in separately mounted filters caused by spacing effects and misalignment and misregistration between the detector and the filter.

The integrated spectral imaging detector array and linear variable filter of FIGS. 1 and 2 is adapted for use in a variety of spectral imaging systems. One exemplary system will now be described in detail. Of course, those skilled in the art will understand that the invention can be advantageously exploited in other spectral imaging systems, and that the invention is in no way limited to the following specific implementation.

Figure 3:
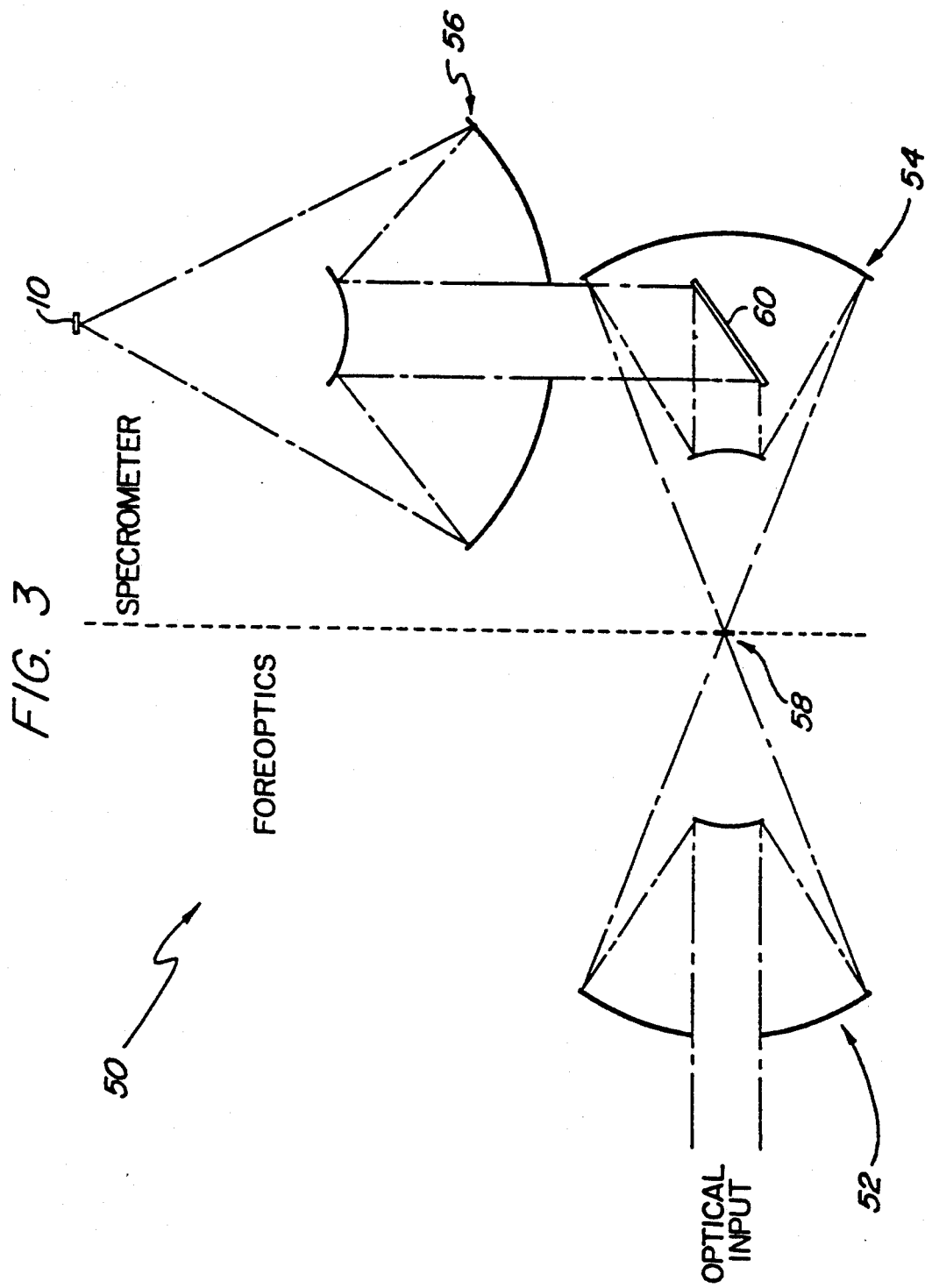
FIG. 3 shows an exemplary spectral imaging system including the detector array with the frequency-varying optical filter of FIG. 1.
Figure 4:
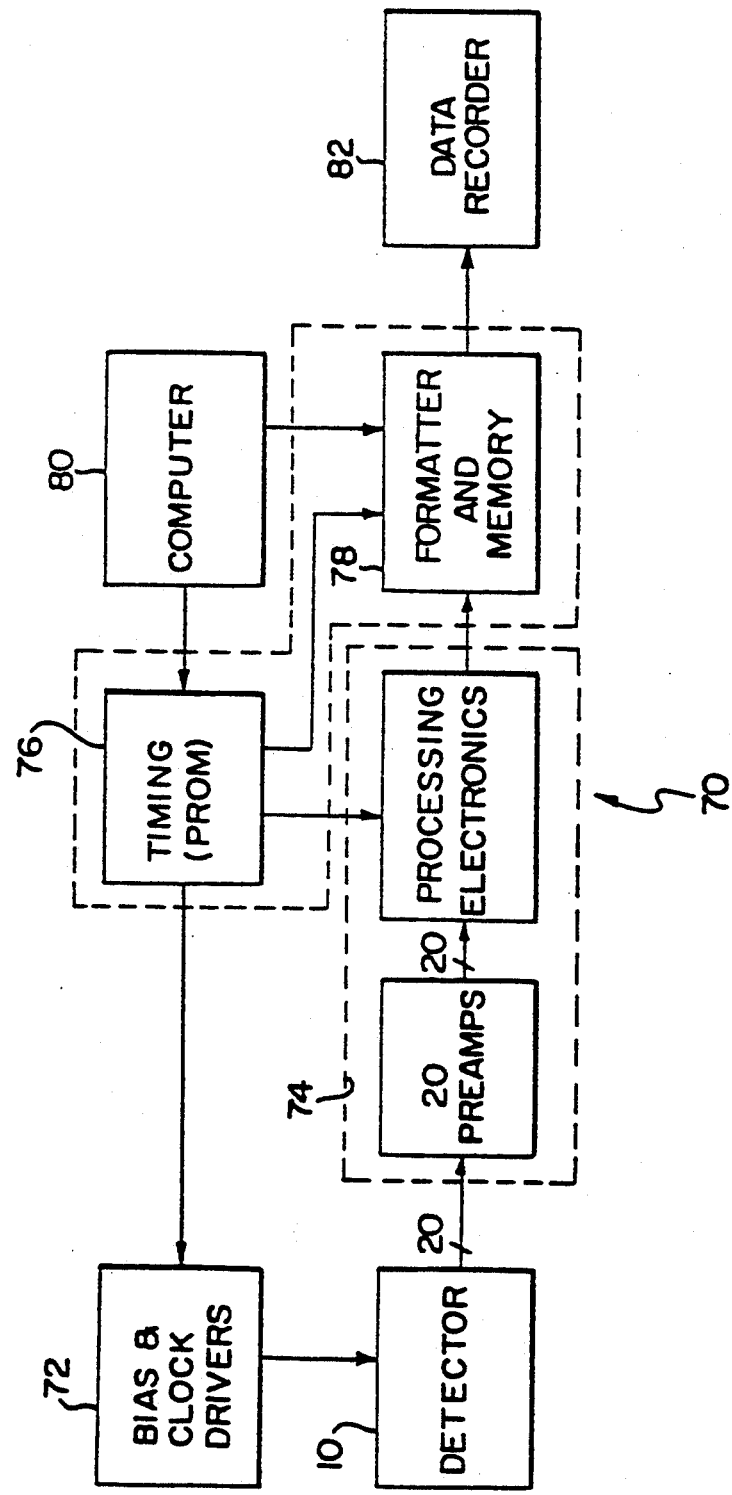
FIG. 4 is a schematic diagram of a data processor for processing spectral image data provided by the spectral imaging system of FIG. 3.

Referring to FIGS. 3–4, the integrated detector array and frequency-varying filter of the invention are implemented within a thermal infrared imaging spectrometer 50. The spectrometer collects spatial and spectral images in the wavelength region of 7.5 $\mu$m to 14.0 $\mu$m.

Specifications of spectrometer 50 are provided in Table I, wherein "CA" represents the clear aperture.

TABLE I

| ELEMENT | System Specifications SPECIFICATION |
|---|---|
| Wavelength Bandwidth | 7.5–14 $\mu$m |
| Spectral Sampling Int. | 0.1 $\mu$m |
| Signal-to-Noise Ratio | 600 |
| NEΔT | 0.1 K @ 300 K & 8 $\mu$m |
| IFOV | 3.6 mrad |
| GIFOV | 10 m @ 2438 m altitude |
| Entrance Window | 38 mm Φ × 3 mm thick ZnS |
| Foreoptics Primary (M1) | 34 mm rad. × 200 mm CA mirror |
| Foreoptics Secondary (M2) | 89 mm rad × 88 mm CA mirror |
| Field defining aperture | 0.1 × 2.0 mm slit |
| Collimator Primary (M3) | 89 mm rad. × 84 mm CA mirror |
| Collimator Secondary (M4) | 34 mm rad. × 21 mm CA mirror |
| Diffraction Grating | 30.2 G/mm on 30 × 41 mm ultra-low-expansion substrate |
| Camera Primary (M5) | 34 mm rad. × 30 mm CA mirror |
| Camera Secondary (M6) | 89 mm rad, × 124 mm CA mirror |
| Vacuum Enclosure Window | 51 mm Φ × 3 mm thick ZnS |
| 80K Stage Window | 38 mm Φ × 3 mm thick ZnS |
| Linear Variable Filter | 1 $\mu$m($\lambda$)/mm with 6.4 × 2.0 mm active area on Si substrate |
| Detector | 64 × 20 100 $\mu$m square elements, extrinsic Si on |

TABLE I-continued

| ELEMENT | System Specifications SPECIFICATION |
|---------|-------------------------------------|
|         | Si multiplexer                      |

Spectrometer 50 includes three Schwarzchild optical systems 52, 54, 56 of equal focal lengths. Each includes complementary primary and secondary mirrors constructed to satisfy the concentric condition defined by R1=1.236F, R2=3.236F, and s=2F, where F is the focal length, R1 and R2 are respective radii of the primary and secondary mirror elements, and S is the vertex spacing between the primary and secondary mirror elements. Thus constructed, contributions of spherical aberration of the complementary primary and secondary mirrors are equal and opposite.

The focal length, F, is chosen to provide a field-of-view (IFOV) of 3.6 mrad/pixel for a detector array 10 size of 64 columns × 20 rows of 100 μm square picture elements. Objective radii of 34 and 89 mm spaced at 55 mm provide a 27.5 mm effective focal length (EFL).

Schwarzchild system 52 images a target onto a one-detector-column sized (0.1×2.0 mm) slit 58 which defines the field of regard for spectrometer 50. Schwarzchild system 54 collimates the target image passing through slit 58 to illuminate a diffraction grating 60.

Grating 60 operates in the first order at $\alpha=58.2°$. Grating 60 is configured to provide a diffracted beam at $\beta=-31.8°$ where $\alpha+\beta=90°$ and with a center wavelength of $\lambda=10.75$ μm. Grating 58 is ruled at 30.2 grooves/mm and blazed at $\theta=12.33°$ for a $\lambda_B'$ of 10.0 μm. The dispersion of grating 58 is $d\lambda/d\beta=0.036$ mrad/nm. Grating efficiency exceeds 50% between 6.7 and 15.0 μm, and resolution for the 41-mm-wide ruled area is 1238.

Schwarzchild system 56 refocuses the dispersed spectral images onto detector array 10, which provides 64 spectral channels with a nominal width of 100 nm and 20 elements of spatial resolution.

The primary and secondary elements of Schwarzchild 56 have larger diameters than those of Schwarzchild 52 and 54 to thereby enhance collection of the widely dispersed image.

Detector 10 includes linear variable filter 12. In this embodiment, filter 12 is a multilayer interference filter. Filter 12 is viewed in 100-μm-wide (spatial) bands, each of which transmits a nominal 250-nm-wide spectral band in registry with grating 60 and is indexed to the columns of detector array 10. Filter 12 blocks 300K background radiation, allowing spectrometer 50 to function at room temperature.

All mirrors are diamond-turned aluminum, goldized and overcoated for enhanced reflectivity at 10.75 μm.

Additional optical elements (not shown) in spectrometer 50 include zinc sulfide windows at an entrance pupil and a detector vacuum enclosure. One or more of the zinc sulfide windows includes an antireflection coating to further attenuate long-wave out-of-band radiation.

The tolerance budget and resulting performance effects for spectrometer 50 are provided in Table II.

TABLE II

Tolerances and Effects on MTF at $\lambda_{CENT}$

| TOLERANCE LIMITS: | | | |
|---|---|---|---|
| Radius | .02 mm | TIR | .10 mm |
| Sag | .05 | Roll | .50 |
| Thickness | .50 | Decenter | .50 |
| MTF: | Diffraction limited | Design nominal | 3σ worst-case |
| On-axis | .887 | .835 | .710 |
| Off-axis | .862 | .698 | .683 |

The transmission wavelength of filter 12 varies from 7.5 μm to 14 μm as a function of location on filter 12 as shown in FIG. 2. Flat areas at each end of filter 12 are run-out tabs where the transmission wavelength does not change. The run-out tabs are added solely to make manufacture and testing of the filter easier.

Without filter 12, detector 10 would detect background radiation at wavelengths ranging from that of room temperature optics out to a wavelength of about 14 μm. The spectrum is cut off at 14 μm by a zinc sulfide window (not shown) placed in the optical path to detector 12.

Filter 12 limits the total background radiation that each element of detector 10 receives to a band-pass of approximately 250 nm, and reduces background radiation by a factor of 25 to 50, depending on the measured wavelength, and allows detector 12 to detect target radiation without being saturated by background.

Detector 10 is a 64×20 element array. To get maximum spectral coverage, the 64 element direction is chosen as the spectral direction, leaving 20 spatial pixels per scan line. Detector 10 is responsive from 6 to beyond 25 micrometers with a quantum efficiency of 28% at 10 micrometers.

Detector elements are each 100 square μm and are positioned 100 μm apart, thus yielding a fill factor of approximately 100%.

The detector elements are arsenic doped silicon detectors (Si:As), connected via indium beads to a self-decoding PMOS multiplexer chip. The PMOS multiplexer chip and its components are of conventional design and, therefore, are not shown in the drawing figures. Preferably, the chip is mounted to, or formed on, substrate 22 (FIG. 2) on portions thereof not covered by array 18.

The PMOS multiplexer chip includes two staggered 10×64 PMOS switching FET arrays and one 6-bit gray code CMOS decoder. Each switching FET array is configured with 10 parallel output lines, which multiplex 64 source-follower-buffered pixel elements per line. The gray code decoder provides a serial-enabling logic sequence to the readout and controls the resetting of each pixel. This hybrid array is mounted in an 84-pin ceramic leadless chip carrier.

The PMOS multiplexer chip is configured such that six address clocks determine which row of 20 pixels is connected to the 20 output buffers at one time. Such a configuration allows the array to be sequentially read out, randomly read out, or selectively read out. For any given address, all 20 pixels in that row are simultaneously read out.

As shown in FIG. 4, an electronics module is provided which includes clock and bias drivers 72 for the detector, signal processors 74, a timing generator 76, a data formatter 78, a computer 80 for operational control, and a data recorder 82. Signal processor 74 includes 20 separate preamplifiers driving four 12-bit A-to-D converters. Pixel information and engineering data are formatted together into four serial bit streams. The serial streams are then converted to Bi-Phase L for output to data recorder 82, which may comprise, e.g., an Ampex AR-1700 analog tape recorder.

The exemplary system thus described detects and records the infrared spectrum of a target. The provision of filter 12 deposited directly onto detector 14 assures permanent alignment of filter and detector, eliminates spectral cross-talk, and yields a high signal-to-noise ratio. Filter 12 and detector 14 remain in alignment at all temperatures.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

I claim:

1. A spectral imaging system for detecting the optical spectrum of a target, the system comprising:
   means for receiving an optical signal from the target;
   dispersion means for dispersing the optical signal into a spectral signal with component spectra of the optical signal provided along a spectral axis having a frequency range;
   detector means aligned with the spectral axis of the spectral signal for receiving and detecting the spectral signal;
   the detector means including an optical filter for substantially eliminating stray and background optical signals from detection by the detector means, the optical filter comprising a plurality of bands, the transmission frequency of the bands varying along the detector means, the optical filter being aligned with the spectral axis of the spectral signal, the transmission frequencies of the bands being matched to and aligned with component frequencies of the spectral image; and
   the optical filter being directly deposited on the detector means such that the optical filter remains in alignment with the detector means despite temperature changes, shock or vibration.

2. The spectral imaging system of claim 1, wherein the dispersion means is a diffraction grating.

3. The spectral imaging system of claim 1, wherein the detector means comprises a photoarray of discrete photodetectors.

4. The spectral imaging system of claim 3, wherein the photodetector array is a silicon photodetector array.

5. The spectral imaging system of claim 4, wherein the photodetector array is formed from direct microlithography of a photosensitive material.

6. The spectral imaging system of claim 5, wherein the photosensitive material is InSb.

7. The spectral imaging system of claim 5, wherein the photosensitive material is HgCdTe.

8. The spectral imaging system of claim 3, wherein the photodetector array is a gallium arsenide photodetector array.

9. The spectral imaging system of claim 3, wherein the photodetector array is a spot diffusion doped extrinsic semiconductor photodetector array.

10. The spectral imaging system of claim 9 wherein the photodetector array is comprised of silicon doped with arsenic.

11. The spectral imaging system of claim 9, wherein the photodetector array comprises silicon doped with bromine.

12. The spectral imaging system of claim 3, wherein said photodetector array comprises:
   a charge coupled device multiplexer formed on a semiconductor substrate;
   a plurality of closely spaced soft metal beads formed on a surface of the multiplexer; and
   a doped photosite array mounted onto the substrate over the soft metal beads.

13. The spectral imaging system of claim 12, wherein the soft metal beads are indium beads.

14. The spectral imaging system of claim 13, wherein the multiplexer is comprised of aluminum gallium arsenide.

15. The spectral imaging system of claim 12, wherein the multiplexer is comprised of polysilicon.

16. The spectral imaging system of claim 1, wherein the optical filter is a multilayer filter.

17. The spectral imaging system of claim 1, wherein the optical filter is an interference filter.

18. The spectral imaging system of claim 1, wherein the optical filter is a thin film filter.

19. The spectral imaging system of claim 1, wherein the frequency range of the dispersion means comprises the infrared frequencies.

20. The spectral imaging system of claim 1, wherein the spectral imaging system further comprises:
   a first Schwarzchild optical system for receiving the optical signal from the target and for focusing the optical signal onto a slit;
   a second Schwarzchild optical system for receiving a portion of the optical signal through the slit and for collimating and reflecting the portion of the optical signal onto the dispersion means for producing the spectral signal; and
   a third Schwarzchild optical system for receiving the spectral signal from the dispersion means and for focusing the spectral signal onto the detector means.

21. A spectral imaging system for detecting the optical spectrum of a target, the system comprising:
   means for receiving an optical signal from the target;
   dispersion means for dispersing the optical signal into a spectral signal with component spectra of the optical signal provided along a spectral axis having a frequency range;
   a photodetector array aligned with the spectral axis of the spectral signal for receiving and detecting the spectral signal, the photodetecter array including:
      a charge coupled device multiplexer formed on a semiconductor substrate;
      a plurality of closely spaced soft metal beads formed on a surface of the multiplexer; and
      a doped photosite array mounted onto the substrate and electrically connected to the charge coupled device multiplexer by the soft metal beads;
   an optical filter for substantially eliminating stray and background optical signals from detection by the photodetector array, the optical filter comprising a plurality of bands, the transmission frequency of the bands varying along the photodetector array, the optical filter being aligned with the spectral axis of the spectral signal, the transmission frequencies of the bands being matched to, and aligned with component frequencies of the spectral image; and
   the optical filter being directly deposited on the photosite array such that the optical filter remains in alignment with the photodetector array despite temperature changes, shock or vibration.

22. A spectral imaging system for detecting the optical spectrum of a target, the system comprising:
means for receiving an optical signal from the target;
dispersion means for dispersing the optical signal into a spectral signal with component spectra of the optical signal provided along a spectral axis having a frequency range;
a photodetector array aligned with the spectral axis of the spectral signal for receiving and detecting the spectral signal, the photodetector array including:
  a doped photosite array mounted onto a semiconductor substrate and comprising a 20×64 array of photosite pixels, each photosite element comprising arsenic doped silicon;
  a PMOS charge coupled device multiplexer formed on the semiconductor substrate beneath said photosite array and having a plurality of charge collector sites arranged to correspond one for one with said photosite pixels;
  a plurality of closely spaced indium beads formed on a surface of the multiplexer, one bead electrically connecting each corresponding pixel and photosite; and
an optical filter for substantially eliminating stray and background optical signals from detection by the photodetector array, the optical filter comprising a plurality of 100 micrometer ($\mu$m) wide bands, each transmitting a 250 nanometer wide spectral band, the transmission frequency of the bands varying along the photodetector array from 7.5 $\mu$m to 14 $\mu$m, the optical filter being aligned with the spectral axis of the spectral signal, the transmission frequencies of the bands being matched to, and aligned with component frequencies of the spectral image; and
the optical filter being directly deposited on the photosite array such that the optical filter remains in alignment with the photodetector array despite temperature changes, shock or vibration.

* * * * *